United States Patent

Nishimori et al.

[11] Patent Number: 5,979,045
[45] Date of Patent: Nov. 9, 1999

[54] METHOD AND APPARATUS FOR MOUNTING COMPONENTS

[75] Inventors: Yuzo Nishimori; Makito Seno, both of Nakagoma-gun; Makoto Nakashima, Kofu, all of Japan

[73] Assignee: Matsushita Electric Industrial Co, Ltd, Osaka, Japan

[21] Appl. No.: 08/981,970

[22] PCT Filed: Mar. 10, 1997

[86] PCT No.: PCT/JP97/00783

§ 371 Date: Jan. 9, 1998

§ 102(e) Date: Jan. 9, 1998

[87] PCT Pub. No.: WO97/34462

PCT Pub. Date: Sep. 18, 1997

[30] Foreign Application Priority Data

Mar. 11, 1996 [JP] Japan ................................ 8-052695

[51] Int. Cl.[6] .............................. H05K 3/30; B23P 19/00
[52] U.S. Cl. ................................. 29/832; 29/740; 29/830
[58] Field of Search .............................. 29/740, 832, 840, 29/741

[56] References Cited

U.S. PATENT DOCUMENTS 4,999,909  3/1991  Eguchi et al. ............................ 29/740
5,329,692  7/1994  Kashiwagi .............................. 29/740
5,365,452  11/1994  Imafuku et al. .
5,743,001  4/1998  Baker et al. ............................ 29/740
5,778,525  7/1998  Hata et al. ............................ 29/740 X

FOREIGN PATENT DOCUMENTS 3919636  12/1989  Germany .
4/177799  6/1992  Japan .
7/336088  12/1995  Japan .

Primary Examiner—Carl J. Arbes
Attorney, Agent, or Firm—Price, Gess & Ubell

[57] ABSTRACT

A component feeding device (1) comprises a first feeder table (7) provided with a plurality of component supply units (6) aligned in parallel rows thereon, and arranged for movement in a direction of the parallel alignment, a second feeder table (8) provided with a plurality of component supply units (6) aligned in parallel rows thereon, and located behind the first feeder table (7), and a transfer unit (9) for receiving and conveying supplementary components from the component supply units (6) on the second feeder table (8) to a predetermined component feeding position. When a certain group of the components on the first feeder table (7) has been exhausted, their new supplies are picked up from the second feeder table (8) by the transfer unit (9), conveyed to the component feeding position, and placed on a board (5), thereby eliminating necessity for providing waiting spaces for feeder tables (7, 8) in a flow direction of boards (5) and increasing productivity with a compact arrangement.

34 Claims, 5 Drawing Sheets

METHOD AND APPARATUS FOR MOUNTING COMPONENTS

TECHNICAL FIELD

The present invention relates to a method of and an apparatus for picking up by a sucking action electronic components and mounting the electronic components or the like on a substrate such as a printed circuit board.

BACKGROUND ART

Recently, there have been more and more need for increasing productivity without expanding the facility of production, and it is thus highly desired to provide an electronic component mounting apparatus with high operating efficiency and productivity per factory space.

Such conventional component mounting apparatuses for electronic devices include known component feeders such as disclosed in Japanese Published Examined Patent Application 3-221326. The disclosed component feeder is now explained by referring to FIG. 5.

Figure 5:
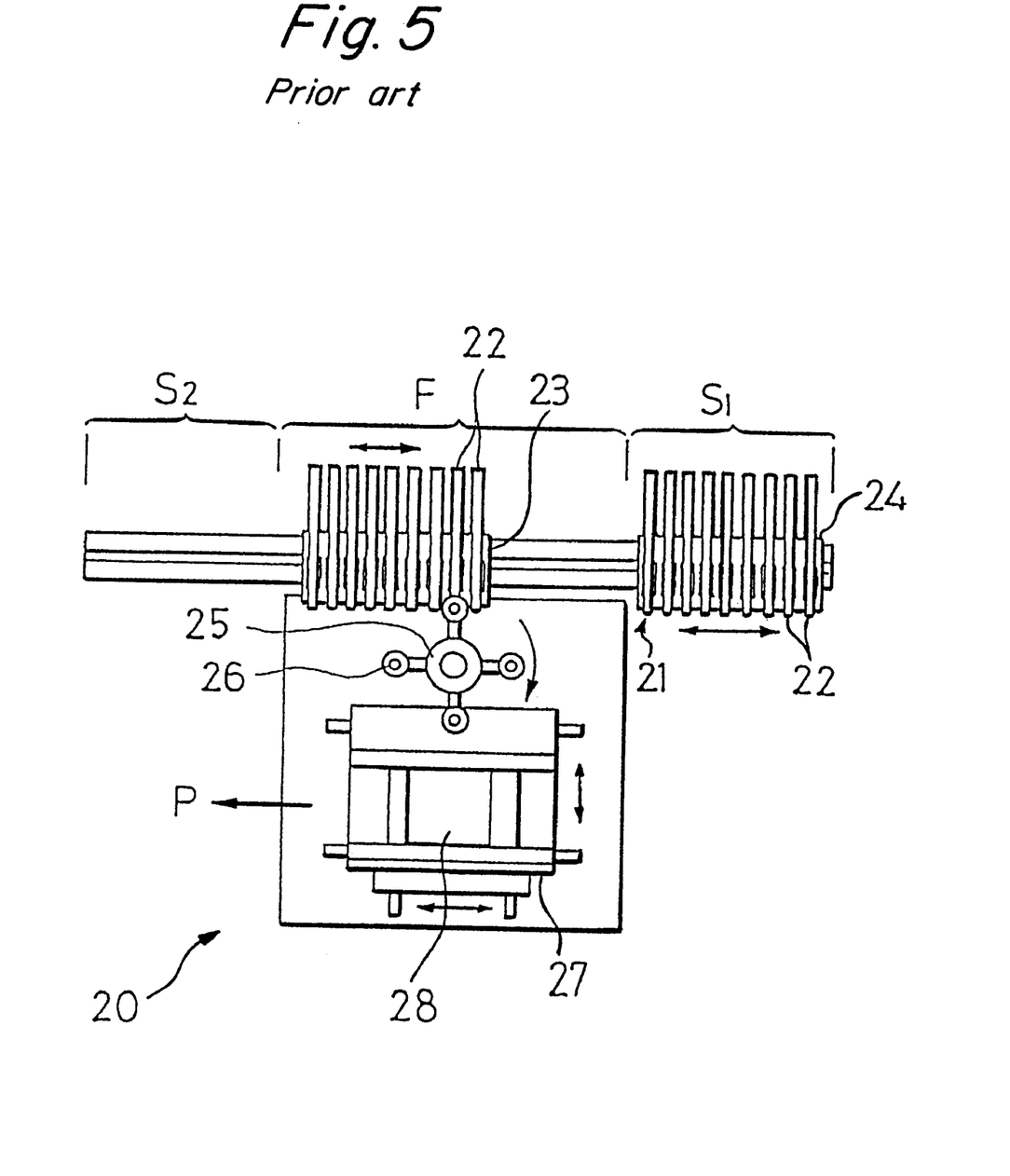
FIG. 5 is a schematic plan view of a conventional apparatus for mounting electronic components.

As shown in FIG. 5, the component feeder 21 comprises a first feeder table 23 and a second feeder table 24, each table having a plurality of component supply units 22 aligned in parallel rows for storage of multiple electronic components and arranged movable independently in a direction of the parallel alignment. Desired ones of the components are fed from the first and the second feeder tables 23, 24 to a predetermined component feeding position. The components supplied by the component feeder 21 at the component feeding position are then mounted by a component mounting apparatus 20 on a board 28 positioned by an X-Y table 27 by way of the sucking action of nozzles 26 on a rotary head 25.

When one of the component supply units 22 on the first feeder table 23 is exhausted, its corresponding component supply unit 22 on the second feeder table 24 is advanced to the component feeding position for supplying supplements for the exhausted components. Accordingly, the feeding of the components can be continued without interruption while the first feeder table 22 is loaded again with new sets of the components, hence maintaining the efficiency of production.

However, the conventional apparatus has the first and the second feeder tables 23, 24 arranged in a row on a rail which is disposed in parallel to a direction P of conveying the board 28, thus requiring a considerably large area for installation of the component feeder 21 including two extra spaces S1 and S2 for stand-by of their respective tables 23 and 24 which are located on both sides of a main space F for feeding the components. When the component mounting apparatus 20 is installed across a production line, it will prevent the entire length of the production line from being minimized and will hardly contribute to an increase of the productivity per factory space.

It is an object of the present invention, in view of the foregoing aspects, to provide a method of and an apparatus for mounting components in at a smaller space and at a higher level of productivity.

DISCLOSURE OF INVENTION

Figure 4:
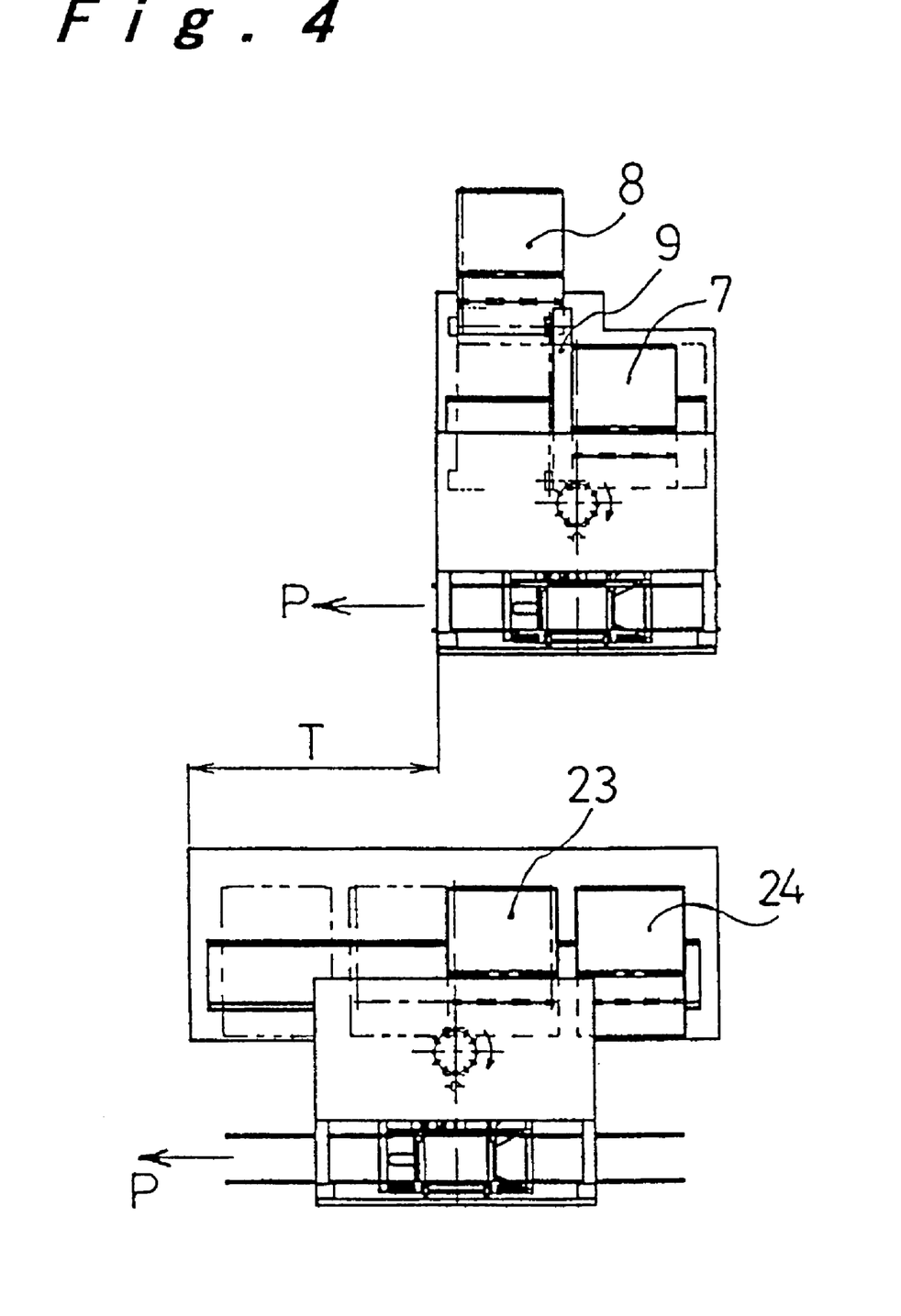
FIG. 4 is a plan view showing comparison of the space for installation between the apparatus for mounting electronic components of the third embodiment of the present invention and a conventional electronic component mounting apparatus.

A method of mounting components according to the present invention is provided for use in a component mounting apparatus comprising: a first feeder table having a plurality of component supply units disposed in parallel rows and loaded with multiple components thereon, the first feeder table being movable in a direction of parallel alignment of the component supply units; a second feeder table arranged behind the first feeder table and mounted with a plurality of component supply units disposed in parallel rows thereon; and a transfer unit for receiving a component from the component supply units disposed on the second feeder table and transferring the component to the predetermined component feeding position. The components are fed from the first feeder table to the component feeding position and mounted on the board, and when it is judged that a particular group of the components on the first feeder table has been run out, the supplements are provided from the second feeder table by the transfer unit to the component feeding position and mounted on the board. Therefore, while there is no need of spaces for stand-by of the two feeder tables in the direction of conveying the board, the component mounting apparatus will be minimized in the space for installation and increase the productivity. FIG. 4 is a plan view showing a comparison between a conventional component mounting apparatus and an electronic component mounting apparatus according to a third embodiment of the present invention which will be described later in more detail. As apparent from FIG. 4, the apparatus of the present invention is remarkably reduced in width (narrower by T than the conventional apparatus).

Also, the supplements for the components on the first feeder table which are expected to be exhausted in a while may preparatorily be picked up and held by a plurality of suction nozzles mounted on the transfer unit, hence increasing the productivity.

It is also possible to temporarily suspend the mounting operation when a given component supply unit has exhausted its components until all the other components of other component supply units of the first feeder table are mounted on the board, when the transfer unit supplies supplementary components for the exhausted component on the first feeder table from the second feeder table for further mounting operation thereof. This will also contribute to the increase of the productivity.

An apparatus for mounting components according to the present invention is characterized by a first feeder table mounted with a plurality of component supply units aligned in parallel rows thereon in which a multiplicity of components are stored, the first feeder table being movable in a direction of parallel alignment of the component supply units for providing predetermined components to a predetermined component feeding position; a second feeder table located behind the first feeder table and mounted with a plurality of component supply units thereon aligned in parallel rows; a transfer unit having a suction nozzle for receiving and conveying supplementary components from the component supply units on the second feeder table to the component feeding position when it is judged that a certain group of the components on the first feeder table has been exhausted; a mounting nozzle for receiving the components by sucking action at the component feeding position and placing them on a board; and an X-Y table for positioning the board. The component mounting apparatus when used with the above method of mounting components will offer the effects as described above.

The transfer unit may be arranged to be movable in the direction of parallel alignment of the component supply units on the second feeder table independently of the first feeder table, which will allow the first feeder table to be replenished while the transfer unit continues to supply the components, thereby increasing the operating efficiency.

The transfer unit may have a plurality of suction nozzles, whereby a plurality of supplementary components for the exhausted components will be picked up and held in advance of the mounting action.

The second feeder table is located lower than the first feeder table by a distance equal to a difference between a level of the suction nozzle(s) on the transfer unit picking up components at the second feeder table and a level of the suction nozzle(s) transferring the components to the mounting nozzle. This permits the transfer unit to be simplified in construction.

The component supply units on the second supply table may be arranged in the same order as that of the component supply units of the first feeder table, thereby facilitating the control and inventory procedures.

BEST MODES FOR CARRYING OUT THE INVENTION

First Embodiment

Figure 1:
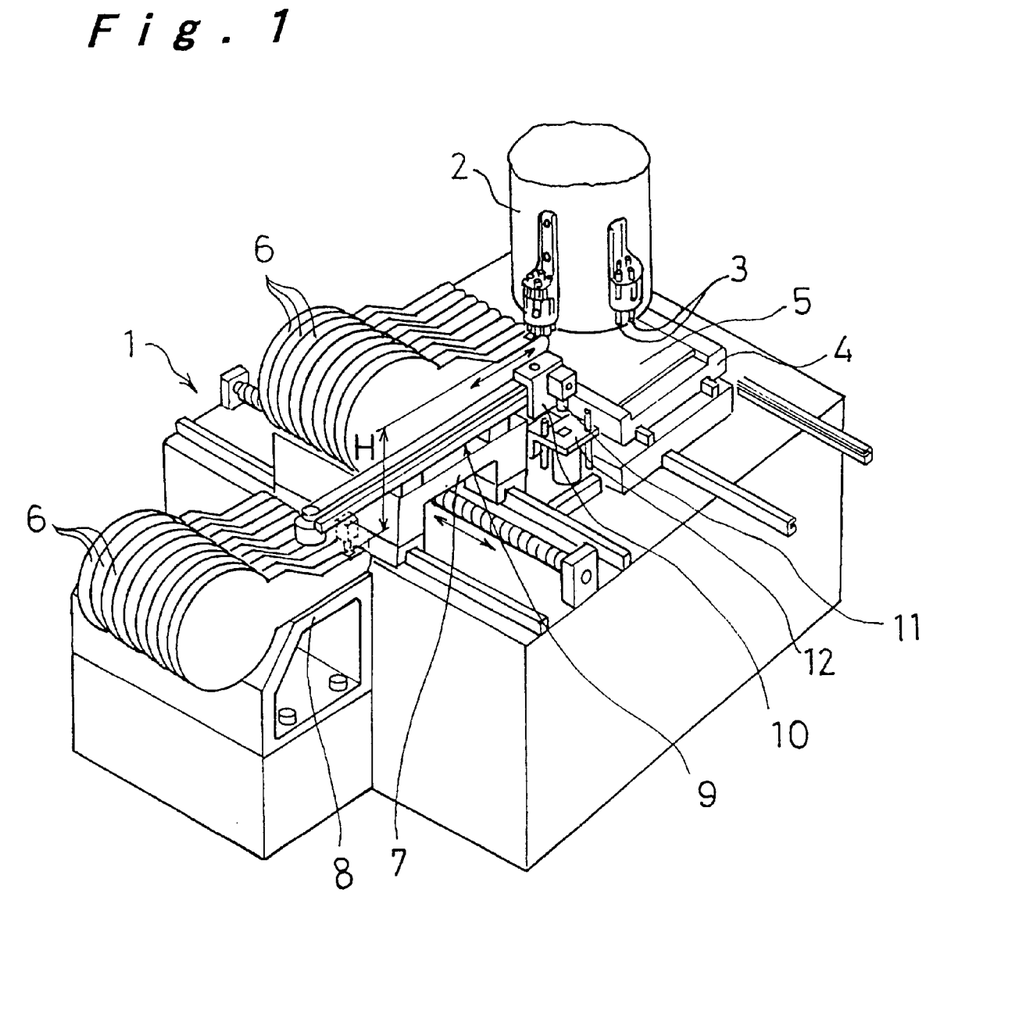
FIG. 1 is a schematic perspective view of an apparatus for mounting electronic components according to a first embodiment of the present invention.

A first embodiment of the present invention will be described referring to FIG. 1. Shown in FIG. 1 are a component feeding device 1, a rotary head 2 for picking up components by sucking action at a predetermined component feeding position in the component feeding device 1 and mounting them on a board 5, nozzles 3 mounted to the rotary head 2, and an X-Y table 4 for positioning the board 5.

The component feeding device 1 comprises a first feeder table 7 having a plurality of component supply units 6 in which a large number of different components are stored and arranged in parallel rows, the table 7 being movable in a direction of parallel arrangement for carrying the components to the component feeding position, a second feeder table 8 having a plurality of component supply units 6 and located behind the first feeder table 7, and a transfer unit 9 fixed to one side of the first feeder table 7 for picking up supplementary components from the component supply units 6 of the second feeder table 8 and carrying them to the component feeding position when it is judged that the components on the first feeder table 7 have been run out.

In this embodiment, the first and the second feeder tables 7, 8 are identical in alignment of the component supply units 6 so that replenishment of components into the component supply units 6 can be facilitated by referring to the other group of the component supply units 6. Also, this permits the use of input data for NC operation hence increasing the efficiency and reliability of a preparatory procedure.

The transfer unit 9 comprises a carriage 10 arranged movable between a component pick-up position of each component supply unit 6 of the second feeder table 8 and the component feeding position in the component feeding device 1, a suction nozzle 11 mounted to the carriage 10 for pivotal movement through 180 degrees about the horizontal axis, and a lifting means 12 located beneath the component feeding position for receiving components from the suction nozzle 11 and lifting them up to the component feeding position at a predetermined height.

The suction nozzle 11 of the transfer unit 9 is designed so that when it turns upward, its level is equal to the height of the component pick-up position of the component supply units 6 on the first feeder table 7, thus allowing the nozzles 3 of the rotary head 2 to similarly receive the components. On the other hand, the height of the component pick-up position of the component supply units 6 on the second feeder table 8 is set equal to the level of the suction nozzle 11 of the transfer unit 9 at its downward facing state to pick up the components from the component supply units 6 on the second feeder table 8. The second feeder table 8 is thus located lower by a distance H in the height than the first feeder table 7.

The operation of the component mounting apparatus of the first embodiment will be explained. When a desired one of the component supply units 6 on the first feeder table 7 loaded with one group of components is transferred to the component feeding position, the nozzles 3 on the rotary head 2 pick up components by sucking action from the component supply unit 6 at the component feeding position. The rotary head 2 is then turned for placing down the components held by the nozzles 3 on the board 5 positioned by the X-Y table 4. By repeating this procedure, the board 5 is loaded with a predetermined set of different components.

When it is detected that the components of the component supply unit 6 on the first feeder table 7 are run out, the first feeder table 7 is moved aside and the transfer unit 9 is positioned to the corresponding component supply unit 6 on the second feeder table 8 loaded with the same components. When the suction nozzle 11 picks up the component, the carriage 10 is moved forward. The first feeder table 7 is at the same time moved back to bring the suction nozzle 11 to locate at the component feeding position.

If the component held by the suction nozzle 11 is identical in the shape of both the front and back sides, the nozzle 11 is turned 180 degrees and the component is transferred to the nozzle 3 of the rotary head 2. When the component is different in the front and back sides, it is transferred from the suction nozzle 11 to the lifting means 12. Then the carriage 10 is retracted so that the lifting means 12 can lift up to transfer the component to the nozzle 3 of the rotary head 2 which picks up the component for mounting on the board 5.

According to the first embodiment, the second feeder table 8 is located behind the first feeder table 7 which carries the transfer unit 9 for transferring components from the second feeder table 8 to the rotary head 2. This allows the component mounting apparatus to be narrowed in the direction of conveying the boards 5 while responding quickly to the consumption of components, hence contributing to the efficiency of the production.

It is possible to so construct the unit so that when a particular group of the components on the first feeder table 7 has been exhausted and fails to be mounted, the mounting of other groups of components on other component supply units 6 is continued until a full set of the different components excluding the consumed group are placed on the board 5, when the supplements for the exhausted group are supplied and placed by the action of the second feeder table 8 and the transfer unit 9.

Second Embodiment

A second embodiment of the present invention will be described referring to FIG. 2. Descriptions of like devices denoted by like numerals as explained in the first embodiment with FIG. 1 will be omitted and only the differences will be explained.

Figure 2:
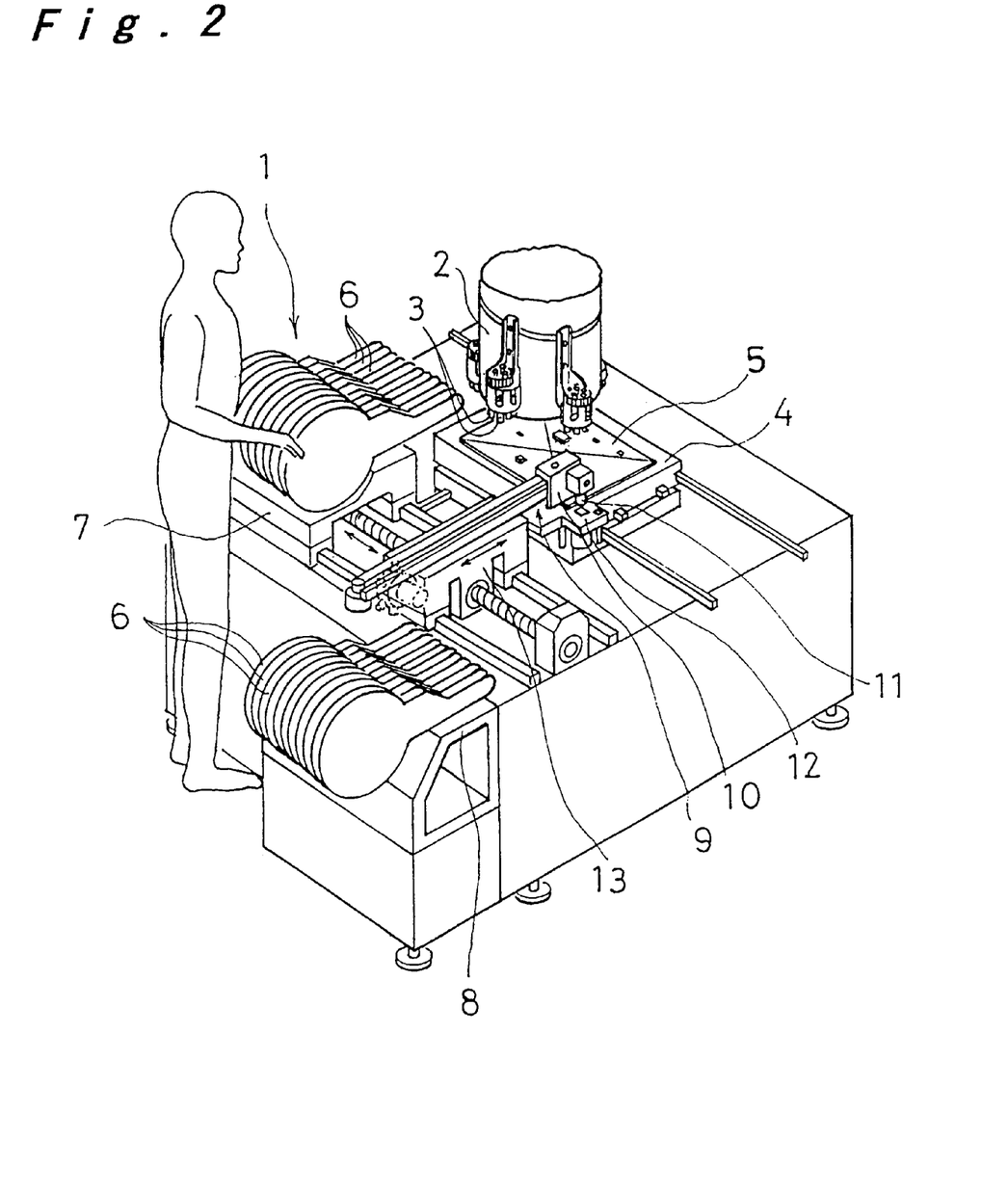
FIG. 2 is a schematic perspective view of an apparatus for mounting electronic components according to a second embodiment of the present invention.

As shown in FIG. 2, the transfer unit 9 is mounted on a transfer table 13 which is driven by a hollow motor for example, a pair of motors coaxially mounted on the same drive shaft for movement separately of the first feeder table 7.

The operation of mounting components in this embodiment will be described. While the components are being supplied from the first feeder table 7, the transfer unit 9 on the transfer table 13 stays at one end of the apparatus not to disturb the feeding movement of the first feeder table 7. When a particular group of the components on the first feeder table 7 has been run out, the first feeder table 7 is moved aside at the other end of the apparatus with respect to the transfer table 13. Simultaneously, the transfer table 13 moves in and allows the transfer unit 9 to advance to the corresponding component supply unit 6 of the second feeder table 8 where the supplements for the exhausted group of components on the first feeder table 7 are stored. The supplements are then picked up and transferred by the carriage 10 of the transfer unit 9 to the component feeding position while the transfer table 13 is moved for alignment at the component feeding position to transfer the components to the nozzles 3 of the rotary head 2 for mounting on the board 5.

In the second embodiment, the first feeder table 7 and the transfer table 13 with the transfer unit 9 are moved separately from each other. This permits the first feeder table 7 to be replenished with the components while the second feeder table 8 is feeding their supplements with the help of the transfer unit 9 of the transfer table 13, thus giving no interruption of feeding action and increasing the efficiency of production.

Third Embodiment

A third embodiment of the present invention will be described referring to FIG. 3. Descriptions of like devices denoted by like numerals as explained in the second embodiment with FIG. 2 will be omitted and only the differences will be explained.

Figure 3:
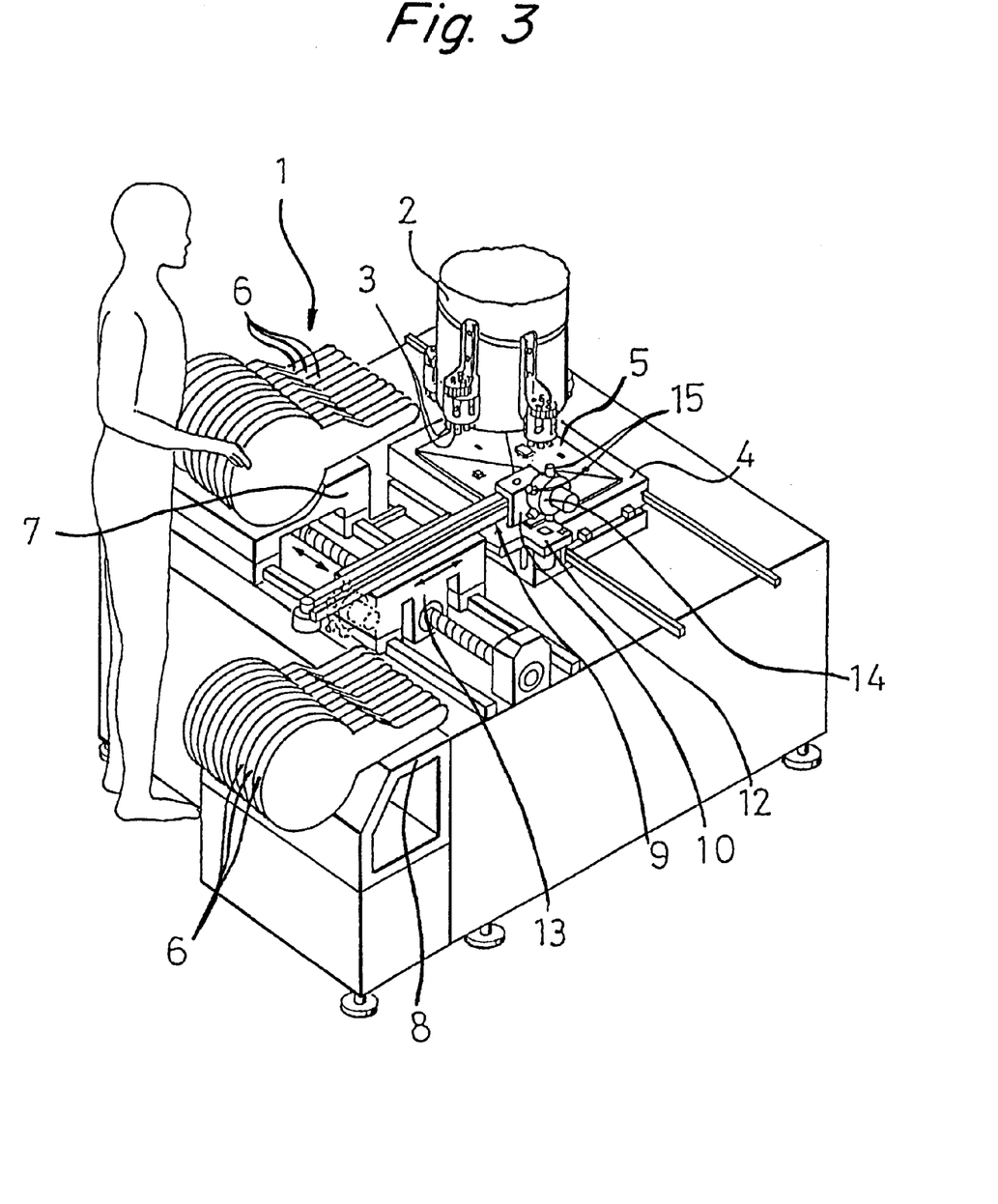
FIG. 3 is a schematic perspective view of an apparatus for mounting electronic components according to a third embodiment of the present invention.

Referring to FIG. 3, a nozzle head 14 is mounted to the carriage 10 on the transfer unit 9 for rotation about its horizontal axis. A plurality of suction nozzles 15 are mounted to the circumference of the nozzle head 14.

The operation of the component mounting apparatus according to this embodiment will be explained. When a specific group of the components has been exhausted and a plurality of that component are required to be supplied, or when several different groups of the components are concurrently exhausted on the first feeder table 7, the nozzle head 14 picks up the supplements on the second feeder table 8 by rotating and changing the suction nozzles 15. A plurality of the supplementary components are thereby picked up, which are transferred by the carriage 10 to the component feeding position while the transfer table 13 is at the same time moved to a desired position. The nozzle head 14 brought to the component feeding position is then revolved to transfer the supplementary components from its suction nozzles 15 to the nozzles 3 of the rotary head 2 in sequence for placement on the board 5.

This embodiment permits a plurality of supplements to be picked up and fed in a sequence by the nozzle head 14 hence minimizing the loss of movement of the transfer unit 9 and increasing the efficiency of production.

The component mounting apparatus of the third embodiment may perform another feeding procedure which is explained below. Each component supply unit 6 on the first feeder table 7 is provided with remanent component detectors for monitoring the remaining number of the components stored. When the components stored in the component supply unit 6 are reduced to a predetermined number, the remanent component detectors emit a detection signal and direct the transfer table 13 to move and carry the nozzle head 14 of the transfer unit 9 to the component pick-up position of the corresponding component supply unit 6 on the second feeder table 2 where the supplements are stored, where the suction nozzles 15 pick up desired supplementary components and wait in a stand-by mode. The same action is repeated in response to detection signals from their respective detectors, until the suction nozzles 15 are fully occupied with the supplements picked up from the different component supply units 6 of the second feeder table 8. Meanwhile, when it is judged that the nozzles 3 of the rotary head 2 have no more components supplied thereto, the carriage 10 on the transfer unit 9 and the transfer table 13 are actuated to move the nozzle head 14 to the component feeding position so that the corresponding supplements can be transferred to their respective nozzles 3 of the rotary head 2 for further mounting-operation.

This embodiment predicts the consumption of components and allows the suction nozzles 15 to pick up and hold the supplements in advance, hence minimizing the operating time of the transfer unit 9 for-picking up the supplements one by one and traveling to the component feeding position, and increasing the efficiency of production.

Industrial Applicability

As set forth above, the method of mounting components according to the present invention includes the steps of supplying desired components from a first feeder table to a component feeding position and placing them on a board, and when it is judged that the desired components on the first feeder table have been exhausted, conveying their supplements from a second feeder table to the component feeding position and placing them on the board. Therefore, while there is no need of spaces for stand-by of the two feeder tables in the direction of conveying the board, the space required for installing the component mounting apparatus will be minimized as shown in FIG. 4 and also, the productivity will be increased.

The supplements for the components on the first feeder table which are expected to be run out in a while may preparatorily be picked up and held by a plurality of suction nozzles mounted on the transfer unit before the consumption, hence increasing the productivity.

It is also possible that when a particular group of the components on the first feeder table has been exhausted and fails to be mounted, the remaining components are continuously mounted until all of them are fully mounted on the board, when the supplements for the exhausted group are picked up from the second feeder table by the transfer unit and mounted on the board. This will also contribute to the increase of the productivity.

The component mounting apparatus of the present invention comprises a first feeder table being movable in a direction of parallel alignment of component supply units thereon for supplying desired components to the component feeding position, a second feeder table located behind the first feeder table, a transfer unit for receiving and conveying supplementary components from component supply units on the second feeder table to the component feeding position when it is judged that a particular group of the components on the first feeder table has been exhausted, a mounting nozzle for receiving the components by sucking action at the component feeding position and placing them on a board, and an X-Y table for positioning the board. The component mounting apparatus when used with the above method of mounting components will offer the same effects as prescribed.

The transfer unit may be arranged movable in the direction of the parallel alignment of component supply units on the second feeder table independently of the first feeder table. This provides the same advantages and allows the first feeder table to be loaded with new components while the transfer unit is feeding the supplements for the exhausted components from the second feeder table, hence increasing the operating efficiency.

The transfer unit may be provided with a plurality of suction nozzles, whereby several supplements for the exhausted components will be picked up and held before or after the mounting action and the productivity will be increased.

The second feeder table is located lower than the first feeder table by a distance equal to the difference between the level of the suction nozzle on the transfer unit picking up the supplements and the level of the same transferring the supplements to the mounting nozzle. This permits the transfer unit to be simplified in construction.

The component supply units on the second supply table are arranged in the same order as that of the component supply units of the first feeder table, hence facilitating the control and inventory procedures.

Accordingly, the present invention is applicable to a method or an apparatus for mounting components.

We claim:

1. A method of mounting components on a substrate from a plurality of component supply units, with a movable member that can remove components from a component supply unit and place the components on the substrate, comprising the steps of:

providing a substrate;

positioning a first component supply unit for operative contact with the movable member to directly remove a first component from the first component supply unit to place the first component on the substrate;

positioning a second component supply unit at a position beyond an operative range of movement of the movable member;

activating a transfer unit to remove a second component from the second component supply unit and to translate the removed component to a position within the operative range of movement with the movable member;

moving the movable member to the transfer unit; and removing a second component from the transfer unit and positioning the removed component on the substrate.

2. The method of claim 1 wherein the step of removing the second component from the transfer unit includes inverting the second component and mounting the second component on a lifting means for transfer to the movable member.

3. The method of claim 1 wherein the second component supply unit is positioned vertically below the first component supply unit and the transfer unit removes the second component and inverts the second component.

4. The method of claim 1 wherein the first component supply unit mounts a plurality of components and moves each component to within the operative range of movement of the movable member.

5. The method of claim 1 wherein the transfer unit is mounted for unitary movement with the first component supply unit in one direction and translates the second components from the second component supply unit in a second direction relative to the first component supply unit.

6. The method of claim 1 wherein the first component supply unit is mounted on a first feeder table and the transfer unit is mounted on a transfer table and further including the step of moving the first feeder table and the transfer table along a common axis.

7. The method of claim 1 further including detecting the status of first components in the first component supply unit and activating the transfer unit to remove a second component from the second component supply unit at a predetermined detected value.

8. The method of claim 7 wherein the first and second component supply units are positioned to move in parallel directions on one side of the substrate.

9. The method of claim 1 further including a plurality of different components mounted on the first component supply unit and the steps of detecting when one of the different components is depleted, applying the remaining first components to the substrate while activating the transfer unit to provide the depleted component from the second component supply unit.

10. An apparatus for mounting components on a substrate, comprising:

a movable member for placing components on the substrate;

a first feeder table;

a first component supply unit mounted on the first feeder table for providing components that can be picked up by the movable member;

a second component supply unit mounted at a position offset from the first feeder table and at a position beyond an operative pickup range of movement of the movable member for providing components to be mounted on the substrate; and a transfer unit movable between the second component supply unit and the pickup range of movement of the movable member to remove components from the second component supply unit and to position the removed components for transfer to the movable member whereby the second component supply unit does not move within the pickup range of movement of the movable member during operation of the apparatus.

11. The apparatus of claim 10 wherein the second component supply unit is positioned vertically lower than the first component supply unit and the transfer unit removes the component from the second component supply unit and inverts the component.

12. The apparatus of claim 10 wherein the transfer unit is mounted on the first feeder table and means for moving the first feeder table.

13. The apparatus of claim 10 wherein the transfer unit is mounted on the first feeder table for unitary movement with the first component supply unit in one direction and translates the component from the second component supply unit in another direction.

14. The apparatus of claim 10 wherein a transfer table mounts the transfer unit and the transfer table and the first feeder table are moved along a common axis.

15. The apparatus of claim 10 wherein a detector unit detects the status of components in the first component supply unit and the transfer unit is activated to remove a second component from the second component supply unit when the detector unit detects a predetermined value.

16. The apparatus of claim 10 further including a lifting means for receiving the component from the transfer unit and for providing the component to the movable member.

17. The apparatus of claim 10 wherein the movable member includes a first suction nozzle and the transfer unit includes a second suction nozzle that can rotate about a horizontal axis.

18. The apparatus of claim 10 wherein the first component supply unit and the second component supply unit are mounted on the same side of the substrate.

19. The apparatus of claim 18 wherein the second component supply unit is positioned vertically lower than the first component supply unit and the transfer unit removes the component from the second component supply unit.

20. The apparatus of claim 19 wherein the transfer unit is mounted on the first feeder table and means for moving the first feeder table.

21. The apparatus of claim 19 wherein the transfer unit is mounted on the first feeder table for unitary movement with the first component supply unit in one direction and translates the component from the second component supply unit in another direction.

22. The apparatus of claim 19 wherein a transfer table mounts the transfer unit and the transfer table and the first feeder table are moved along a common axis.

23. The apparatus of claim 19 wherein a detector unit detects the status of components in the first component supply unit and the transfer unit is activated to remove a second component from the second component supply unit when the detector unit detects a predetermined value.

24. The apparatus of claim 23 further including a lifting means for receiving the component from the transfer unit and for providing the component to the movable member.

25. The apparatus of claim 24 wherein the movable member includes a first suction nozzle and the transfer unit includes a second suction nozzle that can rotate about a horizontal axis.

26. An apparatus for mounting components on a substrate, comprising:

a movable member for picking up and placing components on the substrate;

a first feeder table;

a first component supply unit mounted on the first feeder table for providing components to the movable member at a load position;

a second feeder table positioned vertically at a lower position than the first feeder table;

a second component supply unit mounted on the second feeder table at a position offset from the first feeder table for providing components to the movable member; and a transfer unit movable between the second component supply unit and the load position to remove components from the second component supply unit and to position the removed components at the load position for transfer to the movable member whereby the second component supply unit does not move to the load position during operation of the apparatus.

27. An apparatus for mounting components on a substrate, comprising:

an X-Y table for supporting a substrate that can be moved to enable a positioning of components on the substrate;

a movable mounting nozzle that can pick up components by a suction force to adhere the components to the nozzle;

a first feeder table positioned on one side of the X-Y table;

a first component supply unit mounted on the first feeder table for providing components to the movable mounting nozzle for loading so that the components are addressed by the movable mounting nozzle to directly remove a component from the first component supply unit;

a second feeder table positioned offset from the first feeder table and at a greater distance from the movable mounting nozzle than the first feeder table;

a second component supply unit mounted on the second feeder table at a position offset from the first feeder table for storing components for the movable mounting nozzle; and a transfer unit, movable between the second component supply unit and a position for loading that is addressed by the movable mounting nozzle, to remove components from the second component supply unit and to position the removed components for transfer to the movable mounting nozzle whereby the second component supply unit remains remote from the movable mounting nozzle during operation of the apparatus.

28. The apparatus of claim 27 wherein the second component supply unit is positioned vertically lower than the first component supply unit and the transfer unit removes the component from the second component supply unit.

29. The apparatus of claim 28 wherein the transfer unit is mounted on the first feeder table and means for moving the first feeder table.

30. The apparatus of claim 28 wherein the transfer unit is mounted on the first feeder table for unitary movement with the first component supply unit in one direction and translates the component from the second component supply unit in another direction.

31. The apparatus of claim 28 wherein a transfer table mounts the transfer unit and the transfer table and the first feeder table are moved along a common axis.

32. The apparatus of claim 28 wherein a detector unit detects the status of components in the first component supply unit and the transfer unit is activated to remove a second component from the second component supply unit when the detector unit detects a predetermined value.

33. The apparatus of claim 32 further including a lifting means for receiving the component from the transfer unit and for providing the component to the movable member.

34. The apparatus of claim 33 wherein the movable member includes a first suction nozzle and the transfer unit includes a second suction nozzle that can rotate about a horizontal axis.

* * * * *